United States Patent
Gillespie et al.

(10) Patent No.: US 9,727,098 B2
(45) Date of Patent: Aug. 8, 2017

(54) REDUNDANT POWER SUPPLY MOTHERBOARD ASSEMBLY

(71) Applicant: Phoenix Contact Development and Manufacturing, Inc., Middletown, PA (US)

(72) Inventors: Brian John Gillespie, Hummelstown, PA (US); Terry Lee Barber, Harrisburg, PA (US); Michael Anthony Correll, Hershey, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 237 days.

(21) Appl. No.: 14/676,301

(22) Filed: Apr. 1, 2015

(65) Prior Publication Data
US 2015/0362963 A1    Dec. 17, 2015

Related U.S. Application Data

(60) Provisional application No. 62/012,469, filed on Jun. 16, 2014.

(51) Int. Cl.
| | |
|---|---|
| *G11B 33/02* | (2006.01) |
| *H05K 5/00* | (2006.01) |
| *H05K 7/00* | (2006.01) |
| *G06F 1/18* | (2006.01) |
| *G06F 1/26* | (2006.01) |
| *H01T 4/06* | (2006.01) |

(Continued)

(52) U.S. Cl.
CPC .............. *G06F 1/184* (2013.01); *G06F 1/181* (2013.01); *G06F 1/185* (2013.01); *G06F 1/188* (2013.01); *G06F 1/189* (2013.01); *G06F 1/26* (2013.01); *H01R 13/62* (2013.01); *H01T 4/06* (2013.01); *H05K 7/14* (2013.01); *H05K 7/1477* (2013.01); *H05K 7/1482* (2013.01)

(58) Field of Classification Search
CPC ..................................................... H05K 7/1465
USPC ..................................................... 361/679.21
See application file for complete search history.

(56) References Cited

U.S. PATENT DOCUMENTS

| | | |
|---|---|---|
| 6,535,397 B2 | 3/2003 | Clark et al. |
| 6,700,477 B2 | 3/2004 | Schwarz et al. |

(Continued)

FOREIGN PATENT DOCUMENTS

| | | |
|---|---|---|
| DE | 102012213258 A1 | 1/2014 |
| WO | 2013020819 A1 | 2/2013 |

OTHER PUBLICATIONS

International Search Report in corresponding PCT/US2015/028428, European Patent Office, dated Jul. 23, 2015, 10 pages.

(Continued)

*Primary Examiner* — Jerry Wu
(74) *Attorney, Agent, or Firm* — Hooker & Habib, P.C.

(57) ABSTRACT

A redundant power supply motherboard assembly connects control segments of a fieldbus-type control system to a host computer. The assembly has a compact design with pairs of power supply modules in side-by-side nests on the motherboard. The nests are mounted on the motherboard in desired locations and securely hold the modules on the assembly despite vibrations, shocks and handling to prevent contact impairment. The nests provide touch protection for components on the motherboard.

24 Claims, 12 Drawing Sheets

(51) Int. Cl.
*H05K 7/14* (2006.01)
*H01R 13/62* (2006.01)

(56) References Cited

U.S. PATENT DOCUMENTS

| | | | |
|---|---|---|---|
| 7,113,406 B1* | 9/2006 | Nguyen | H01L 23/4006 |
| | | | 165/185 |
| 7,508,690 B2 | 3/2009 | Albers | |
| 8,123,545 B1 | 2/2012 | Correll et al. | |
| 8,379,398 B2 | 2/2013 | Correll et al. | |
| 2005/0018388 A1 | 1/2005 | Shih | |
| 2012/0206848 A1 | 8/2012 | Gillespie et al. | |
| 2012/0243190 A1* | 9/2012 | Correll | H05K 7/1465 |
| | | | 361/756 |
| 2013/0045613 A1 | 2/2013 | Griese et al. | |

OTHER PUBLICATIONS

Machine translation of DE 102012213258.
Pepperl + Fuchs, Compact Fieldbus Hub, MBHC-FB-8R.YO, Data Sheet, 4 pages (A).
Pepperl + Fuchs, Drawing, MBHC-FB-8R.YO, 1 page (B).
Pepperl + Fuchs, Compact Fieldbus Hub, MBHC-FB-8R.RH, Data Sheet, 4 pages (C).
Pepperl + Fuchs, Compact Fieldbus Hub, MBHC-F8-8R-RH, Photographs, 4 pages (D).
Pepperl + Fuchs, Universal Fieldbus Power Hub, MB-FB-4R.YO, Data Sheet, 4 pages (E).
Pepperl + Fuchs, High-Density Fieldbus Power Hub, MBHD-FBI-4R.YO, Data Sheet, 4 pages (F).
Pepperl + Fuchs, Motherboard, MBHD-F81-4R, Photographs, 2 pages (G).
Pepperl + Fuchs, Universal Fieldbus Power Hub, MB-FB-4R.YO, Data Sheet, 4 pages (H).
Pepperl + Fuchs, Universal Fieldbus Power Hub, MB-FB-4R.GEN, Data Sheet, 5 pages (I).
Pepperl + Fuchs, Motherboard and assembly, MB-FB-4R.GEN, Photographs, 5 pages (J).
Pepperl + Fuchs, Fieldbus Power Hub, MB-FB-GTR, Photographs, 2 pages (K).
Pepper + Fuchs, Motherboard for Honeywell power supply modules, Photographs, 3 pages (L).
Cooper Crouse-Hinds, Redundant fieldbus power for Yokogawa, Data Sheet, 5 pages (M).
Cooper Crouse-Hinds, Redundant fieldbus power for Yokogawa, Data Sheet, 4 pages (N).
Turck, Motherboard assembly, DPC-49-4RMB, Photographs, 3 pages (O).
Relcorn, Inc., Motherboard assembly, F892-CA, Photographs, 2 pages (P).

\* cited by examiner

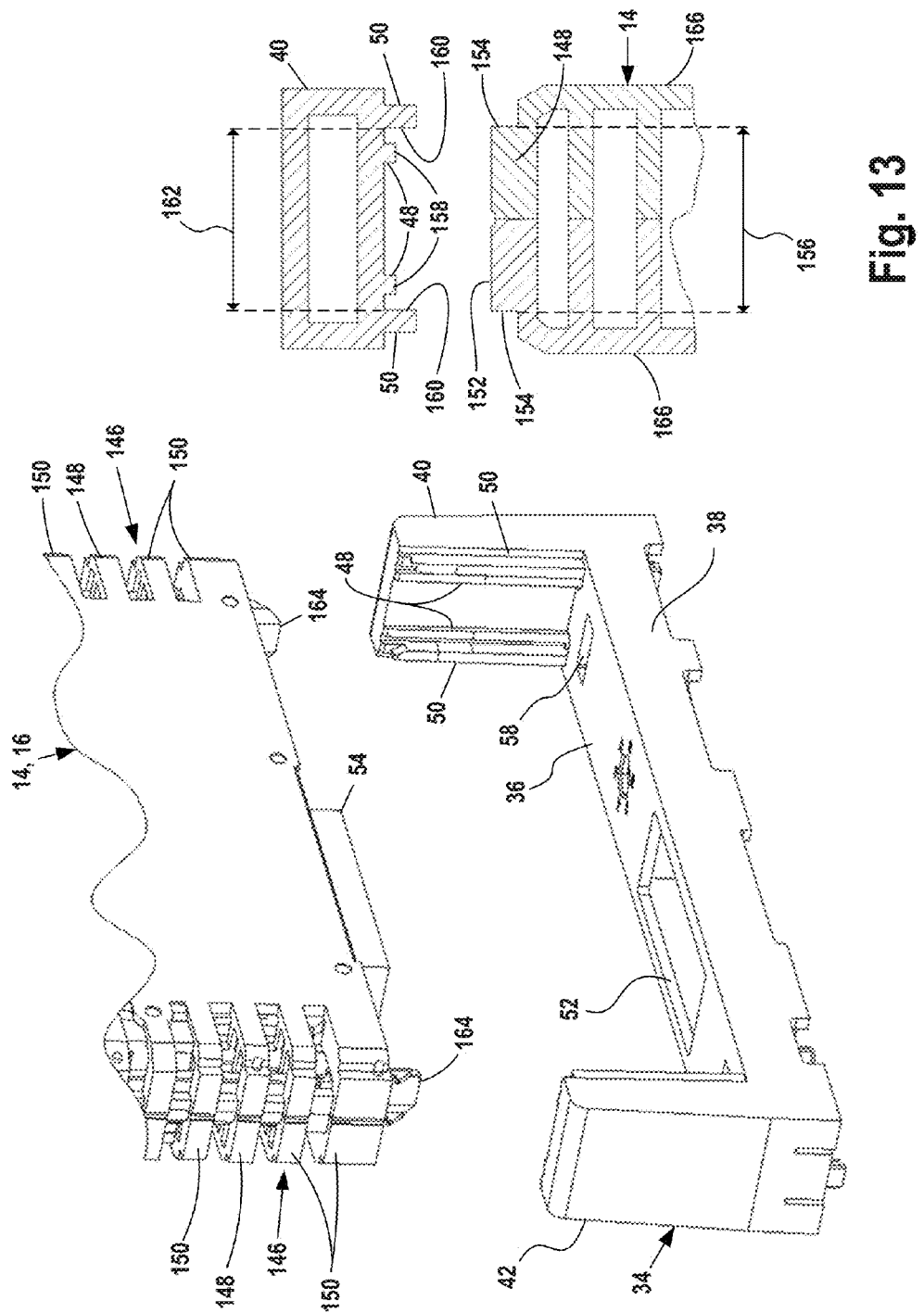

REDUNDANT POWER SUPPLY MOTHERBOARD ASSEMBLY

Complex industrial systems are typically operated by fieldbus-type systems having a number of control segments which are connected to a host computer with a HMI. Industrial components are spaced along the control segments. The components may include valves, heaters, switches, motors, sensors and the like used in the industrial system. The segments communicate AC signals between the host and the components in each segment and supply DC power to the components.

Motherboard assemblies are used to connect the segments to the host and to supply DC power to the segments. The assemblies are connected to one or more bulk power supplies and typically include redundant power supply modules and a diagnostic module. The power supply modules provide back-up power to each control segment in the event of power failure. Redundant power supply modules assure uninterrupted power is supplied to each segment despite failure of bulk power or of one of the two power supply modules for the segment. Failed power supply modules may be physically replaced without requiring that the assembly be disconnected from the bulk power supply to make the replacement.

The diagnostic module provides information to the host on the operation of the motherboard assembly, power supply modules and control segments.

Power supply and diagnostic modules used in motherboard assemblies have a fixed width which determines the minimum length of the motherboard assembly. The motherboard assembly may support four redundant pairs of power supply modules and a single diagnostic module. The modules are mounted side-by-side along the length of the assembly so that the assembly length is slightly greater than the width of the nine modules.

In the disclosed motherboard assembly, each module is mounted in a nest secured to the top of the motherboard. The nests are spaced side-by-side along the length of the motherboard. Central portions of the nests are weakened due to wide openings for contact noses on the modules. The nests are mounted on the motherboard without distorting the nests despite the weakened central portions of the nests. Distortion of the nests could prevent proper insertion of the modules in the nests and could impair electrical connections between components in the modules and components on the motherboard.

The nests extend over components and contact tails soldered on the motherboard and provide touch-prevention shields above the motherboard to protect components and tails on the motherboard from inadvertent contact when a module is or is not inserted into a nest.

The nests have sidewalls with recesses above the motherboard which provide space for mounting components and solder tails on the motherboard under the sidewalls of the nest. This facilitates placement of components on the motherboard to reduce the size of the motherboard.

The modules extend a distance above the nests so that vibrations or shocks transmitted to the assembly could relatively move the assembly and modules and impair electrical connections between module contacts and contacts on the motherboard. Impaired connections prevent proper operation of the system. Elastic interference fit connections secure the modules to the nests to prevent impaired electrical connections due to vibrations or shocks.

The disclosed motherboard assembly includes an alarm series circuit which provides a signal to the host computer HMI when either the output power voltage or current for a power supply module in the assembly falls outside normal ranges. The alarm series circuit is used when a diagnostic module is not used.

Each power supply module has a relay which opens when the DC output voltage or current fall outside a normal range. The alarm monitoring series circuit extends through all of the relays and to the host computer. One module output voltage or current outside a normal range opens the relay for the module, breaks the circuit and generates a signal at the host computer HMI to alert an operator to the failure and the necessity of replacing the failed power supply module with an operational power supply module. The alarm monitoring circuit may be altered by use of bridge wiring to include the relays in power supply modules mounted in the assembly, even when modules are not mounted in all nests in the assembly.

BRIEF SUMMARY OF THE DRAWINGS

FIG. 12 is a perspective view showing a module prior to insertion into a nest on the assembly;

FIG. 13 is an exploded horizontal sectional view through a nest arm and an adjacent interference fit portion of a module;

DESCRIPTION OF PREFERRED EMBODIMENT

Redundant power supply motherboard assembly 10 is removably mounted on DIN rail 12 and supports four redundant pairs of like power supply modules 14 and a similar geometry diagnostic module 16 mounted at one end of the assembly. The DIN rail typically extends vertically or horizontally along the back surface of a control cabinet.

In each assembly 10, adjacent redundant pairs of modules 14 supply DC power to each of four foundation fieldbus segments connected to the assembly. If one power supply module fails, an alarm circuit will indicate a power supply failure and the other power supply module will maintain power to the segment until the failed module is replaced. Fieldbus data signals are communicated through the assembly between the segments and a conventional host computer system. The data signals are isolated from the power supply modules by inductors.

Figure 6:
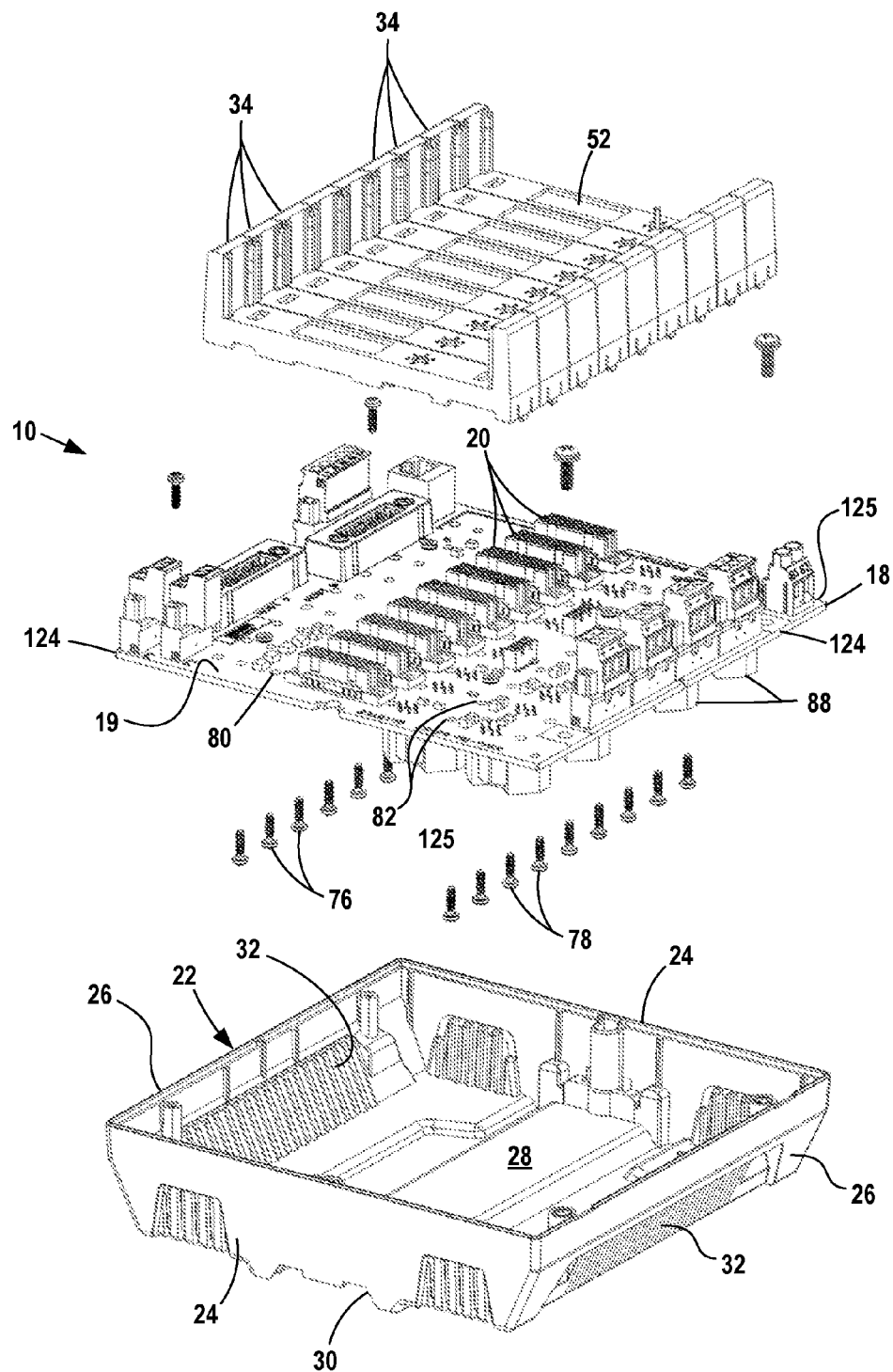
FIG. 6 is an exploded view of the assembly.
Figure 7:
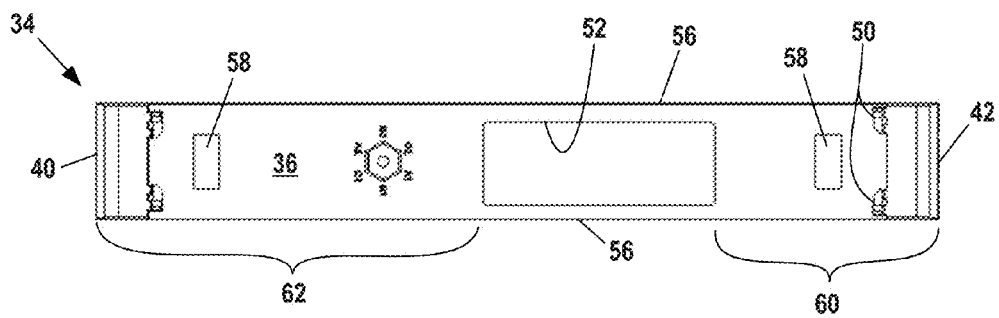
FIGS. 7, 8 and 9 are top, side and bottom views of a module nest.
Figure 8:
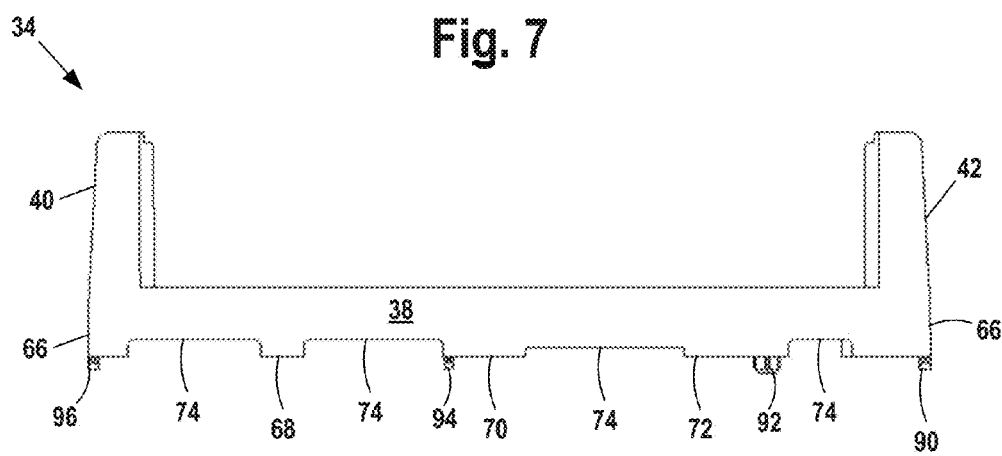
Figure 9:
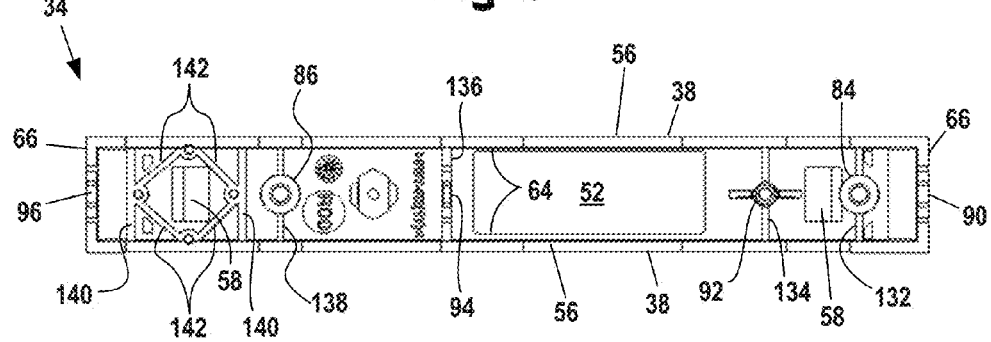
Figure 10:
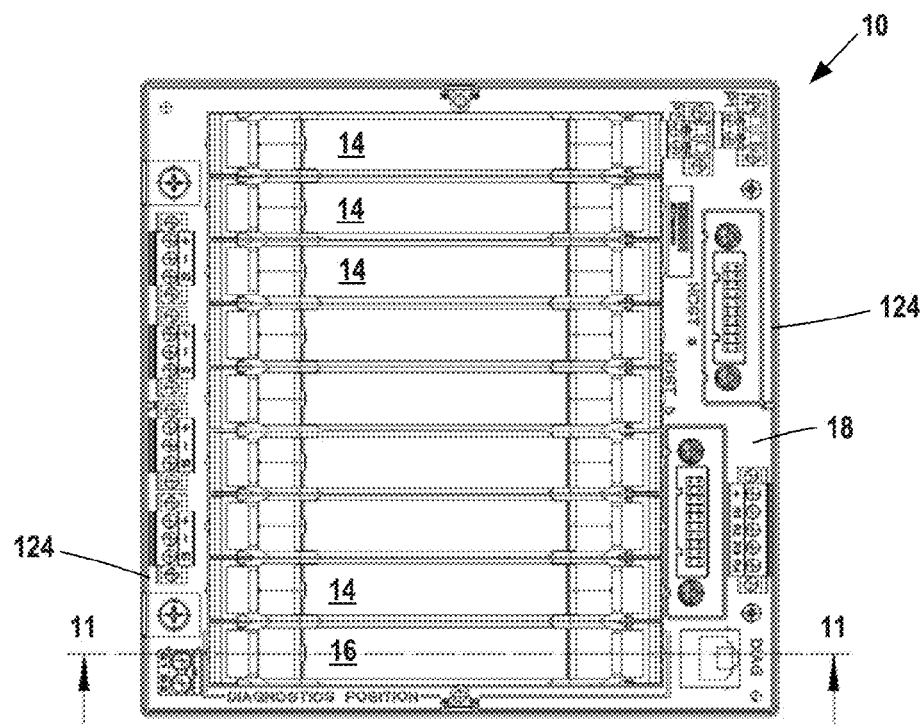
FIG. 10 is a top view of the assembly with modules installed.

As shown in FIG. 6, assembly 10 includes a square motherboard 18 having a top surface 19. Input and output connectors are mounted on the motherboard top surface 19 at opposed edges of the motherboard. Nine module input/output connectors 20 mounted on motherboard top surface 19 are spaced across the length of the motherboard. Connectors 20 are located close together to minimize the length of the motherboard and facilitate side-by-side mounting of the modules on the motherboard with minimum clearance between adjacent modules. The closely spaced connectors 20 minimize the length of the motherboard. The width of the motherboard is minimized to reduce the size of the assembly and minimize the size of cabinets for the assemblies.

Motherboard 18 is mounted on the top of rectangular base 22. Base 22 is molded from a suitable thermoplastic resin. The base has opposed vertical end walls 24 which are joined by angled sidewalls 26. End modules are spaced short distances in from base end walls 24 to minimize the length of the assembly and reduce assembly size. Assembly 10 is square with a length and width of 180 mm.

Bottom wall 28 extends between the lower ends of walls 24 and 26. A DIN rail recess 30 is formed in the bottom wall and extends between end walls 24. Mounting hardware (not illustrated) on the bottom wall of base 22 removably mounts the base on DIN rail 12. Ventilation slots 32 are formed in walls 24 and 26.

The modules have a thickness of 17.5 mm. Modules 14 and 16 are the same shape and have similar bodies and latches as shown in U.S. Pat. No. 8,123,545.

Nine like module nests 34 are mounted side by side on top surface 19 of motherboard 18. The nests are molded from thermoplastic resin. Each nest 34 has an elongate plastic body 35 extending between body ends 37. Module nests 34 are shown in FIGS. 7, 8, 9, 12 and 16. Each nest 34 has a flat top wall 36, opposed vertical sidewalls 38 on either side of and extending down from the top wall 36, and two like vertically extending module support arms 40, 42 at the opposed ends 37 of the nest body 35. Sidewalls 38 are located on opposite sides of connector opening 52 and extend between support arms 40 and 42. Arms 40 are on the fieldbus side 44 of the assembly. Arms 42 are on the host side 46 of the assembly. Arms 40 and 42 extend above wall 36. Each support arm 40, 42 has two vertical interior engagement ribs 48 and a pair of clamp ribs 50 outside of ribs 48. The clamp ribs extend vertically along the height of the arm from wall 36 to the top of the arm. Ribs 50 face each other and frictionally engage the opposed sides of a module rib when the module is inserted into a nest, as illustrated in FIG. 13 and described below.

Rectangular module connector opening 52 extends through wall 36 between arms 40 and 42. Openings 52 are sized to receive connectors 20 on the motherboard. The nest width and module thickness are essentially the same.

The portions of the nest 34 to either end of opening 52 are connected by strips 56 in walls 38 at opening 52. Strips are thin and can flex. Two latch openings 58 extend through wall 36 short distances inwardly from arms 40 and 42.

Connector opening 52 is located closer to support arm 42 than to support arm 40. As a result, nest 34 includes a short, rigid portion 60 extending from the end of opening 52 to arm 42 and a long, rigid portion 62 extending from opening 52 to support arm 40. Each rigid portion 60, 62 includes parts of the two sidewalls 38, part of top wall 36 and strengthening structural features located in the nest between the walls 38 and top wall 36. Rigid portions 60 and 62 are connected by strips 56 in walls 38 at opening 52. The edges of the opening 52 are spaced in from the tops of strips 56 by narrow shoulders 64. The shoulders 64 partially stiffen the strips.

Module nest 34 includes two U-shaped end feet 66 under support arms 40, 42, and middle feet 68, 70 and 72 on walls 38 between feet 66. Vertical recesses 74 are provided at the bottom of the nest sidewalls between feet 66 and 68, 68 and 70, 70 and 72, and 72 and 66. The feet rest flush on the top surface of motherboard 18.

Each nest 34 is mounted on the top of motherboard 18 by two mounting screws 76 and 78. Screws 76 and 78 extend through holes 80 and 82 in the motherboard and are threaded into holes in mounting pillars 84 and 86 in the nest. Mounting pillar 84 is located under the inner edge of nest support arm 42 in the outer end of short rigid portion 60. Mounting pillar 86 is located inwardly from the nest arm 40 in the long rigid portion 62. Pillars 84 and 86 are located centrally between the nest sidewalls 38.

Inductors 88 are mounted on the bottom of the motherboard under the rigid portions 62 of two adjacent nests. The pillars 86 are positioned in from arms 40 at locations permitting access to and tightening of screws 78 mounting the nests on motherboard 18 by a tool extended past the inductors. Mounting of the inductors directly on the bottom of the motherboard saves space and eliminates dependent circuit boards previously used to support inductors in conventional motherboard assemblies, mounting hardware, standoff components, and soldering and assembly operations.

Nest location posts 90, 92, 94 and 96 extend below the bottom of the nest feet centrally between the nest sidewalls. Location post 90 is under the outer end wall of arm 42 on nest short portion 60. Post 92 is located between pillar 84 and opening 52. Post 94 is located at the inner end of long portion 62 adjacent opening 52. Post 96 is located on the outer wall of arm 40 on nest long portion 62.

Figure 2:
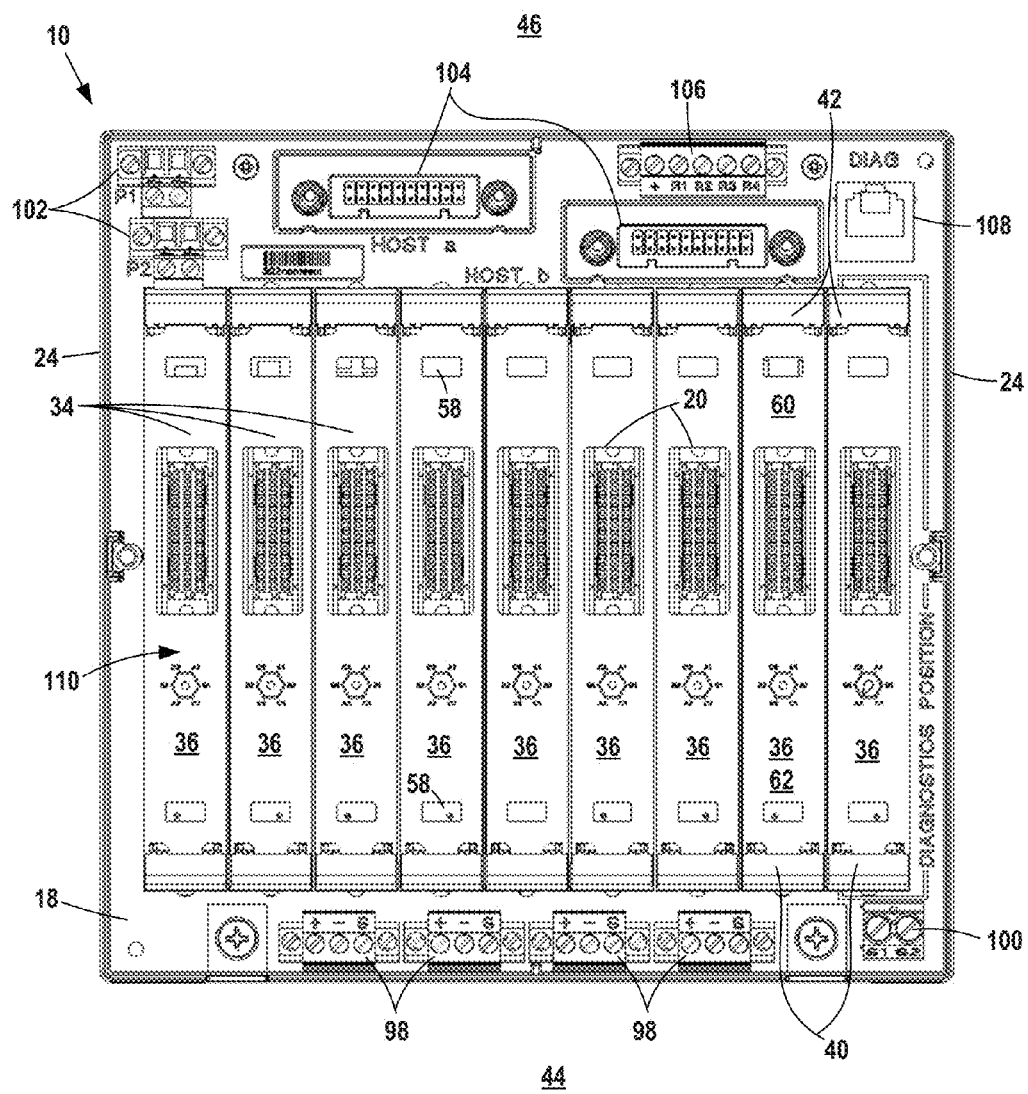
FIG. 2 is a top view of the assembly with the modules removed.
Figure 3:
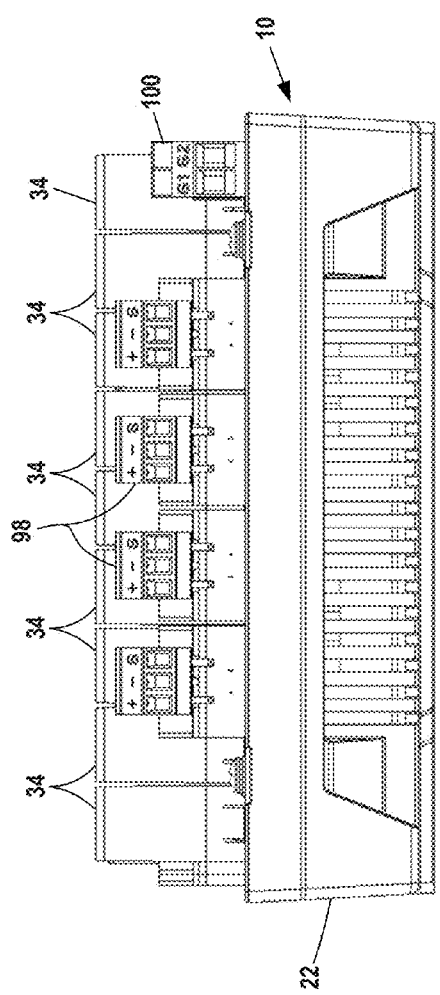
FIGS. 3 and 4 are views of the fieldbus and host sides of the assembly respectively.
Figure 4:
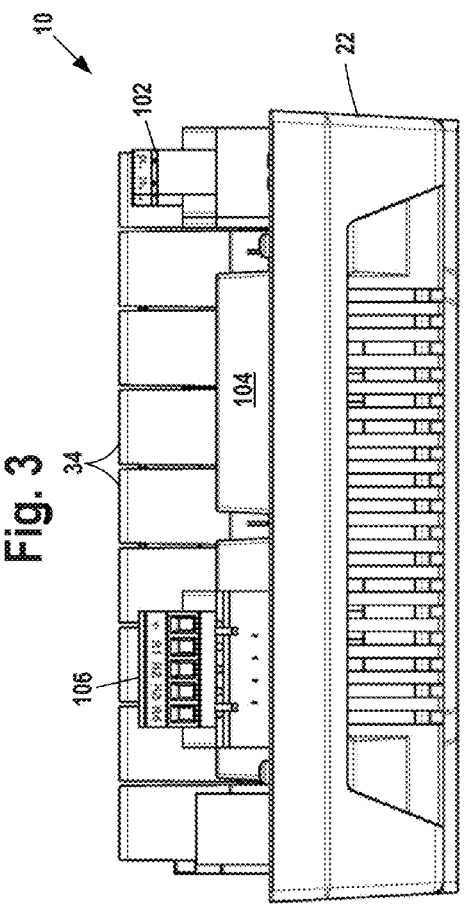

FIG. 2 illustrates the top of motherboard 18 with module nests 34 mounted on the motherboard and a number of electrical components and connectors mounted on the motherboard on the fieldbus side 44 of the assembly. The nests 34 are together side-by-side and extend along the length of the assembly between end walls 24. Four foundation fieldbus segment connectors 98 are mounted on motherboard 18 at the fieldbus side 44 adjacent to long, rigid nest arms 40. Ground terminals 100 are provided to one side of the connectors 98.

A number of connectors are mounted on the host side 46 of motherboard 18 adjacent to nest arms 42. Two pairs of bulk power input terminals 102 are provided at one corner of the motherboard to supply redundant bulk power supply to modules in the assembly. Two host cable connectors 104 on the motherboard provide redundant cable connections to a foundation fieldbus host computer system located away from the assembly. Alternatively, a single host cable connector may be provided for systems that utilize a non-redundant cable connection.

Five alarm monitor terminals 106 provide electrical connections between alarm circuits described below and a monitor for indicating failure of a power supply module 14. Diagnostic RJ45 Ethernet jack 108 supplies diagnostic information from diagnostic module 16 to the host computer system.

Electrical components necessary to the operation of assembly 10 are soldered to circuitry on the top and bottom surfaces of motherboard 18. Components mounted on the bottom of the motherboard may have solder tails extending through holes in the board and project a distance above the top of the board. Vertical recesses 74 on both nest sidewalls 38 provide space above the circuit board for these components and tails. The recesses are spaced away between feet 66, 68, 70 and 72. Components and tails on the motherboard can be freely positioned under the nest sidewalls 38 with the exception of the locations of the feet. Mounting of the nests 34 on the motherboard does not materially restrict efficient location of components on the motherboard at desired locations for spatial and electrical efficiency and minimizing the size of the motherboard. Recesses 74 and openings 52 vent air from the space between motherboard 18 and overlying nests 34 to reduce heat buildup.

Figure 11:
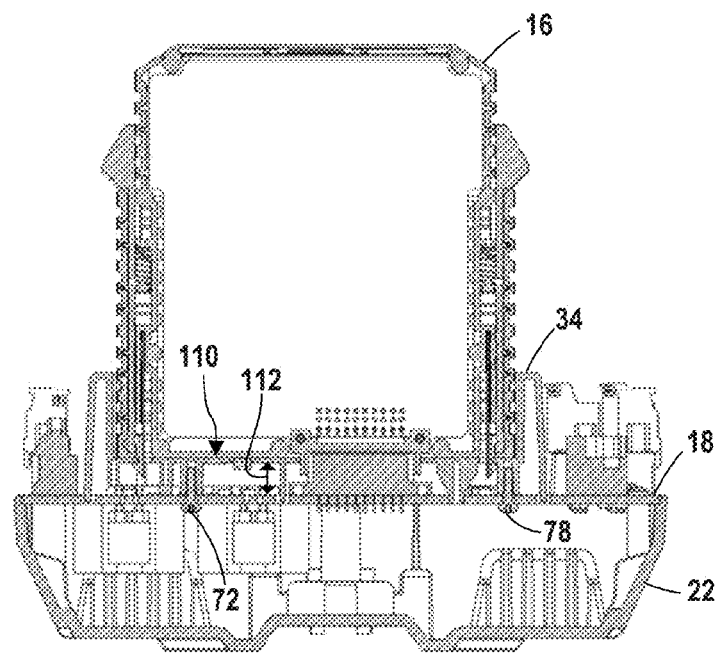
FIG. 11 is a vertical sectional view along line 11-11 of FIG. 10.

As shown in FIGS. 2 and 11, module nests 34 overlie all of the soldered electronic components and tails on the top surface of motherboard 18. The nest top walls 36 are positioned close together to form a flat, multi segment roof 110 extending across the length of the motherboard and overlying the components and tails on the top of the motherboard. Roof 110 is shown in FIGS. 2 and 11 and is located a height 112 above the top surface of the motherboard. Height 112 may be about 9 mm. Module connectors 20 are mounted on the motherboard and extend up distance 112, above the motherboard. The connectors 22 protrude through openings 52 in the nests to engage the noses 54 on the modules.

Distance 112 provides space under the roof for components mounted on the top of the motherboard and tails of components mounted on the bottom of the motherboard which extend through the motherboard. The roof 110 provides top touch protection for the components and tails to prevent inadvertent touching of the circuitry on the top of the motherboard. The end walls of the end nests located at the opposing ends of the assembly provide side touch protection for components on the top of the motherboard.

The roof 110 permits the assembly to meet touch protection requirements with components on the top surface of the motherboard. This facilitates compact location of components and reduction of the size of the motherboard and of the assembly. The modules are held in the nests above roof 110. The distance 112 between the roof and the motherboard provides space for efficient positioning of electronic components on the top of the motherboard.

Figure 17:
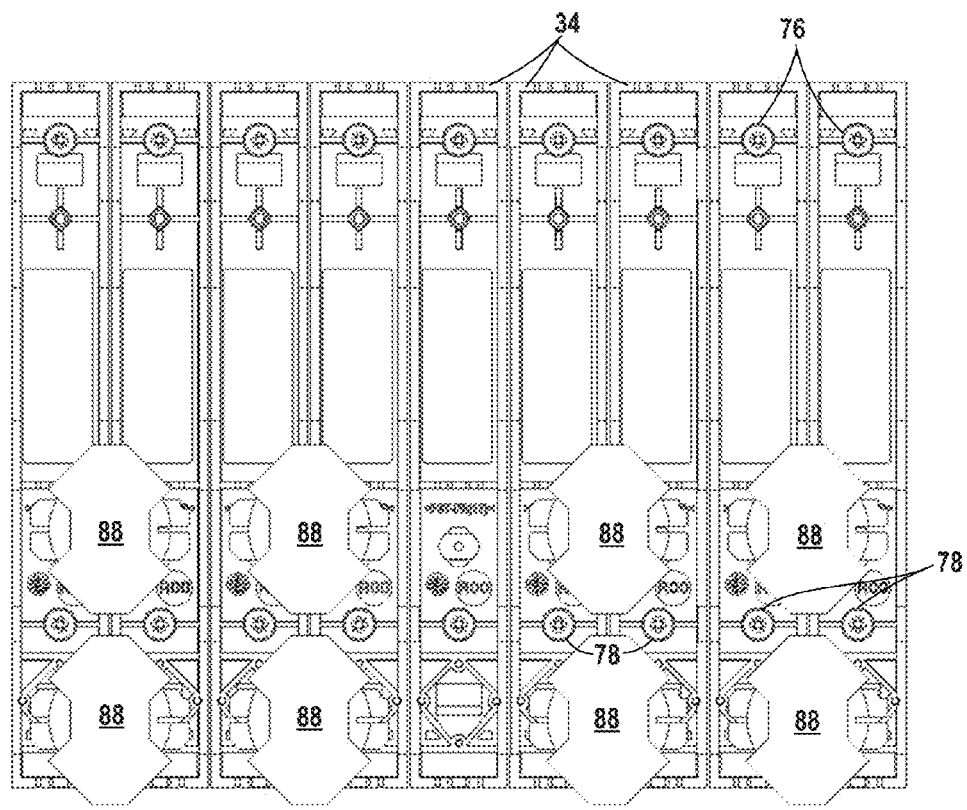
FIG. 17 is a bottom view of nests in the assembly with the motherboard removed and the locations of inductors mounted on the motherboard shown.

Eight inductors 88, shown in outline in FIG. 17, are mounted on the bottom of the motherboard at locations which permit mounting of the nests 34 on the motherboard by screws 78 despite the size of the inductors. The inductors 88 have minimum transverse dimensions greater than the width of nests 34 so that each inductor extends under two nests. Two inductors 88 are positioned under the long, rigid portions 62 of two adjacent nests. The positions of the inductors require the mounting screws 78 be located inwardly from the adjacent end of the nest. Each inductor is connected electrically to one power supply module 14. Inductors 88 block fieldbus data signals from entering the power supply modules, as required by Fieldbus Foundation standards.

The inductors 88 are mounted on the bottom of the motherboard at locations indicated in FIG. 17 in order to permit access to the underside of the motherboard by a tool used to engage and tighten mounting screws 78. The screws extend through screw holes 82 in motherboard 18 and into the cylindrical openings in mounting pillars 86 to secure the nests against the top surface of the motherboard.

Figure 14:
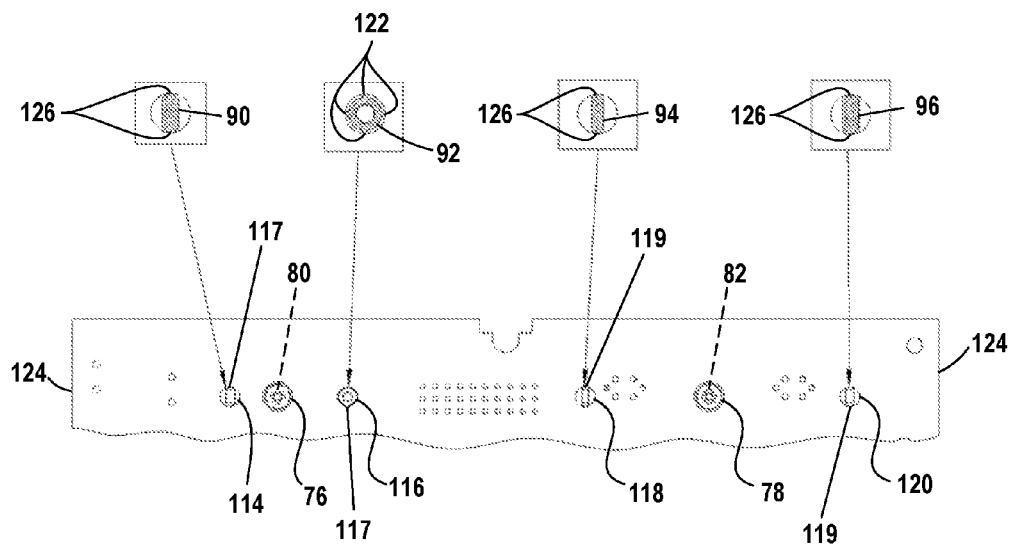
FIG. 14 is a bottom view of a motherboard showing location posts on a nest seated in through openings.

Each nest 34 is mounted on motherboard 18 by positioning module connector opening 52 above a module connector 20 and lowering the nest onto the upper surface of the motherboard so that feet 66, 68, 70 and 72 rest on the top of the motherboard and location posts 90, 92, 94 and 96 extend into circular post openings 114, 116, 118 and 120 which extend through the motherboard. The posts and openings are shown in FIG. 14.

Primary location post 92 contains four 90°-spaced alignment ribs 122 spaced around the post. The post has a snug fit in post opening 116. The engagement between ribs 122 and opening 116 accurately locates the nest between the opposed sides 124 of the motherboard, and between the opposed sides 125 of the motherboard.

Flat location posts 90, 94 and 96 have opposed rounded surfaces 126 which frictionally engage the surfaces on opposed sides of the respective post openings to assure desired orientation of the nest on the motherboard and also to allow slight longitudinal movement of the location posts in openings 114, 118 and 120. The flat posts 90, 94 and 96 may flex sideways. Together, the rounded surfaces on post 92 and the flexibility of posts 90, 94 and 96 accommodate misalignment between the posts and the openings due to the positional tolerances of each, assuring that the longitudinal location of the nest on the motherboard is determined by post 92.

Proper location of the module nests on the motherboard assures that the nests are in correct side-by-side alignment and that the connectors on the inserted modules properly engage the module connectors 20, despite tolerances inherent in circuit board manufacture and manufacture of the molded plastic nests.

The nests are held on the motherboards by mounting screws 76 and 78. Screws 76 are inserted through motherboard holes 80 and are threaded into the bores in mounting pillars 84 on the short rigid nest portions 60. Screws 78 are extended through motherboard holes 82 and are threadably inserted into the bores in pillars 86 in the long rigid nest portions 62.

Figure 15:
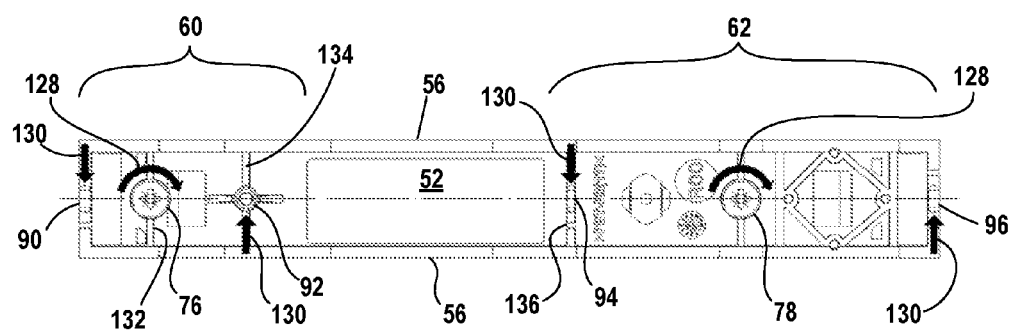
FIG. 15 is a view of the bottom of a nest as mounted on a motherboard with the motherboard removed.
Figure 16:
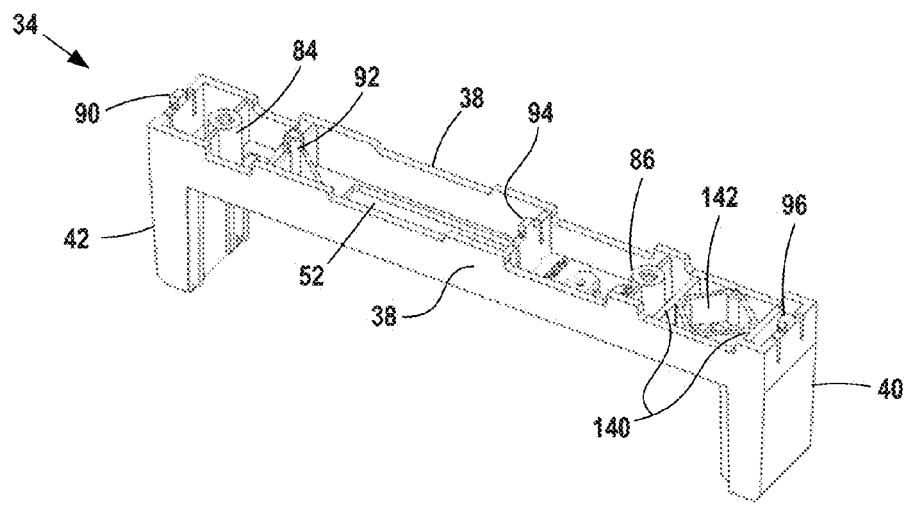
FIG. 16 is perspective view of the bottom of a nest.

Tightening of screws 76 and 78 into the pillars 84 and 86 rotates the threads on the screws into the bores in the pillars and exerts torque on the pillars in the direction of rotation of the screws. This torque is represented by arrows 128 illustrated in FIG. 15. The torque tends to rotate each of the rigid module portions 60 and 62 in a clockwise direction. Posts 90 and 92 in openings 114 and 116 form physical connections 117 at surfaces 126 and 122 to prevent rotation of rigid portion 60 during tightening of screws 76. Posts 94 and 96 in openings 118 and 120 form physical connections 119 at surfaces 126 to prevent rotation of rigid portion 62 during tightening of screw 78. In this way, the screws 76 and 78 may be tightened to mount the nests on the motherboard without rotation of portions 60 and 62. In the absence of the anti-rotation posts 90-96, tightening of the screws could exert sufficient torque on portions 60 and 62 to rotate the portions, flex strips 56 at connector openings 52 and skew the nests on the board. Skewing of the nests on the board can misalign connector opening 52 and shift arms 40 and 42, making it difficult or impossible to mount the modules in the nests. The anti-rotation posts are biased against the sides of the post openings which resist rotation in the directions of arrows 130, shown in FIG. 15.

Figure 1:
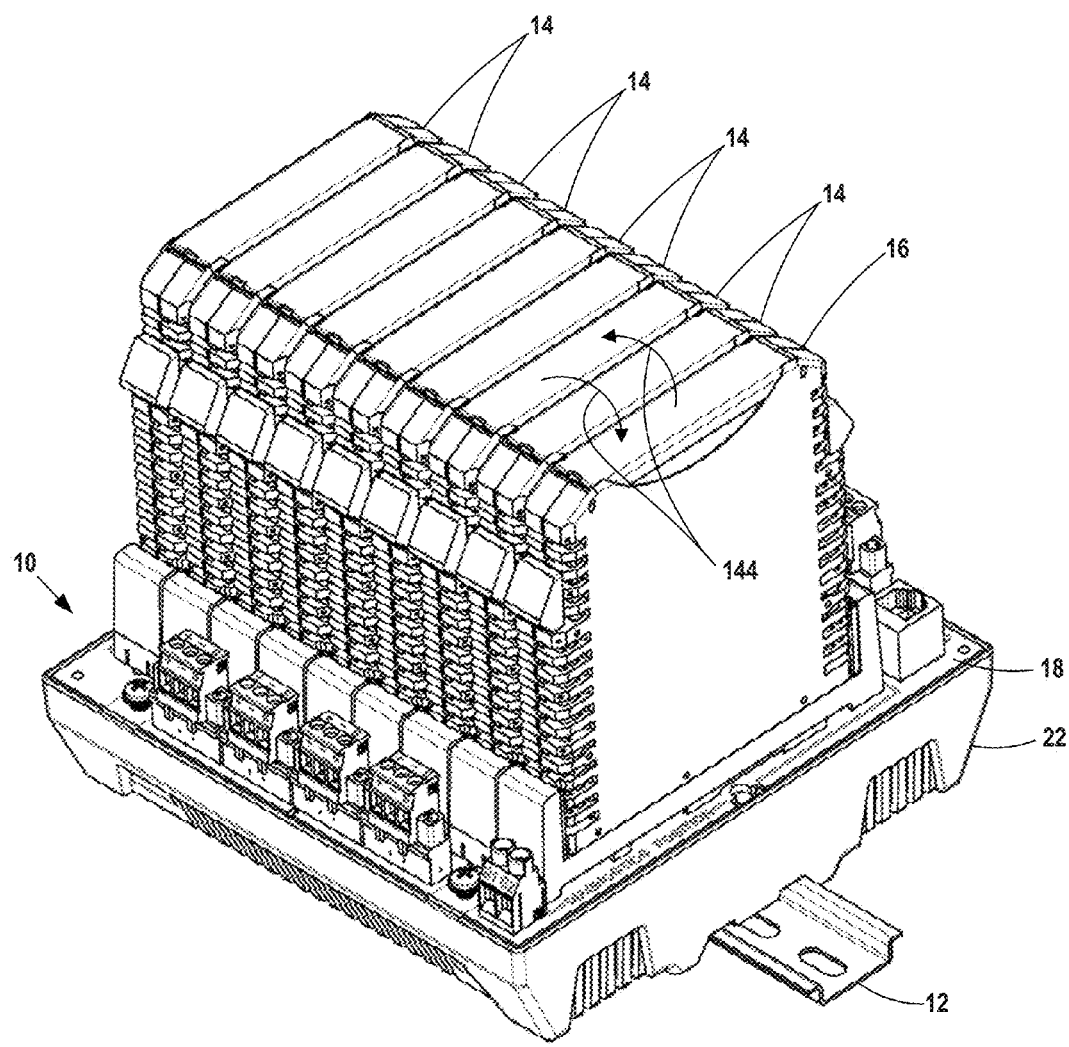
FIG. 1 is a perspective view of a redundant power supply motherboard assembly with mounted modules.

The interior of short rigid portion 60 includes transverse stiffening wall 132 at pillar 84 and transverse wall 134 at post 92. Long portion 62 includes interior stiffening transverse wall 136 at post 94, wall 138 at pillar 86, and a pair of transverse walls 140 and angled rhombic bracing walls 142 surrounding latch opening 58. These walls increase the stiffness of rigid portions 60 and 62 to prevent or reduce flexing of the portions and strips 56 when screws 76 and 78 are tightened or the modules 14, 16 are moved in the direction of arrows 144 in response to vibration, shock or handling. See FIG. 1.

Modules 14 and 16 have identical plastic bodies and identical contact noses 54 for engaging the nests and module connectors 20 mounted on motherboard 18. Opposed lower module edges 146 shown in FIG. 12 are identical in shape and include a series of vertically spaced horizontal ribs 148 and 150 with flat alignment surfaces 152 facing outwardly from the module. Ribs 148 have friction engagement surfaces 154 on both sides of the ribs. Surfaces 154 are spaced apart a thickness distance 156.

Ribs 48 on arms 40 and 42 have inwardly facing engagement surfaces 158. Ribs 50 have engagement surfaces 160 spaced apart a distance 162.

The thickness distance 156 between module friction engagement surfaces 154 on ribs 148 is 0.13 mm greater than the unstressed distance 162 between engagement surfaces 160 prior to insertion of a module into the nest. During insertion of a module into a nest, clamp ribs 50 are elastically moved outwardly about 0.13 mm by retention ribs 148.

Ribs 150 have a sliding fit between clamp ribs 50 on arms 40 and 42. This facilitates initial free piloting of the insertion end of the module into the nest arms 40 and 42, with lower two ribs 150 freely movable between arm ribs 50.

Initial insertion of a module 14, 16 into a nest 34 moves the lower two ribs 150 on each module edge down between the two clamp ribs 50 on each arm 40, 42. Further insertion moves retention ribs 148 between clamp ribs 50. Insertion of ribs 148 between ribs 50 elastically and non-destructively flexes ribs 50 outwardly. The flexed ribs 50 clamp ribs 148 to the arms 40 and 42 and hold the module in place. The surfaces 158 align the module for proper engagement between nose 54 and connector 20. Surfaces 160 also align the module for proper engagement between nose 54 and connector 20.

The non-destructive, elastic clamp connections between the module and the nest assure that the two are held together and prevent movement of the module in the directions of arrows 144 due to shock and vibration of the assembly or improper handling of the modules. The clamped connections prevent relative movement of the contacts in nose 54 and in connector 20 and impairment of electrical connections.

The module is inserted into the nest until module latches 164 extend through latch openings 58 and secure the module on the nest. At the same time, contact nose 54 is extended through the connector opening 52 in the nest and engages module connector 20 on motherboard 18.

Figure 5:
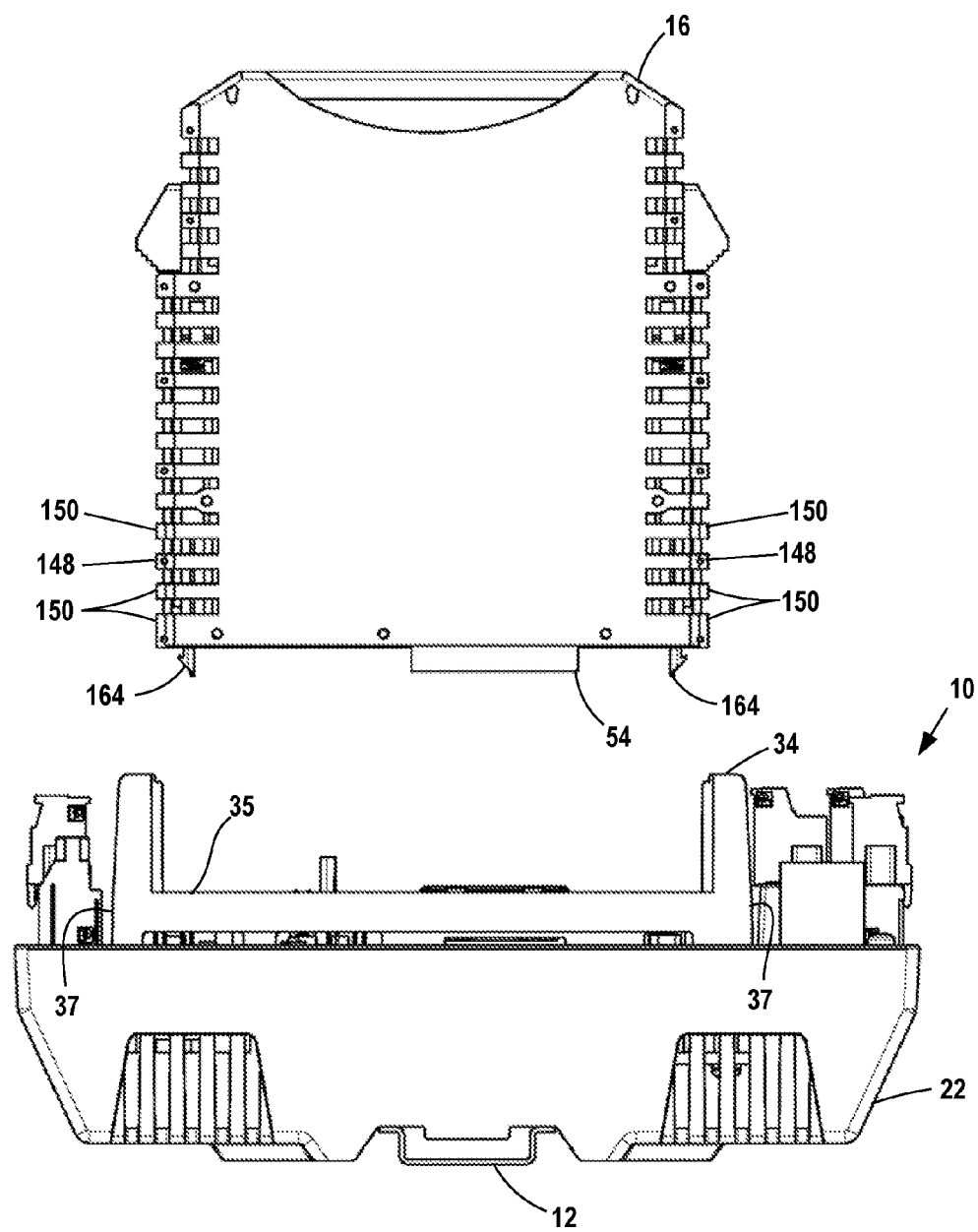
FIG. 5 is an end view of the assembly with a module in position to be mounted on the assembly.

The secure interference fit connection is required to secure the module to the nest because the module extends a distance above the nest. The height of the modules is approximately five times the height of the arms 40 and 42. See FIG. 5. This means that the physical connection must prevent sideways movement of the high modules in the nests in the directions of arrows 144 and potential resultant degradation of electrical connections. The physical connection also prevents vertical movement of the modules in the nests due to latch play.

The 0.13 mm interference fit between the side surfaces 154 and 160 assure elastic deformation of the ribs 50 when the modules are inserted, despite molding tolerances for the nests 34 and the right and left module shells 166 illustrated in FIG. 13. The interference fits with elastic, not permanent, deformation of the ribs 50 on arms 40 and 42, securely hold the module in the nest while permitting repeated insertion and removal of modules into and from the nests.

The output voltage and current supplied by each power supply module 14 to a fieldbus segment is monitored by a relay in each power supply module 14. The relay contacts are closed when the output voltage and current for the module are in normal operating ranges. The contacts open when the voltage or current is not normal.

During operation of assembly 10, diagnostic module 16 monitors performance of the four redundant pairs of power supply modules 14 and the fieldbus segments attached to the assembly at fieldbus segment connectors 98. Output voltages and currents of power supplied by modules 14 to the fieldbus segments are also monitored. This information is supplied to the host computer system which monitors the performance parameters and generates appropriate alarm signals to alert operators concerning performance problems.

If desired, assembly 10 may be used without a diagnostic module 16 mounted on the assembly. In this case, the relays in each module 14 which monitor the voltage and current the power supply module supplies to the fieldbus segment may be connected in a series alarm circuit of the type illustrated in FIGS. 18-20.

Figures 18, 19:
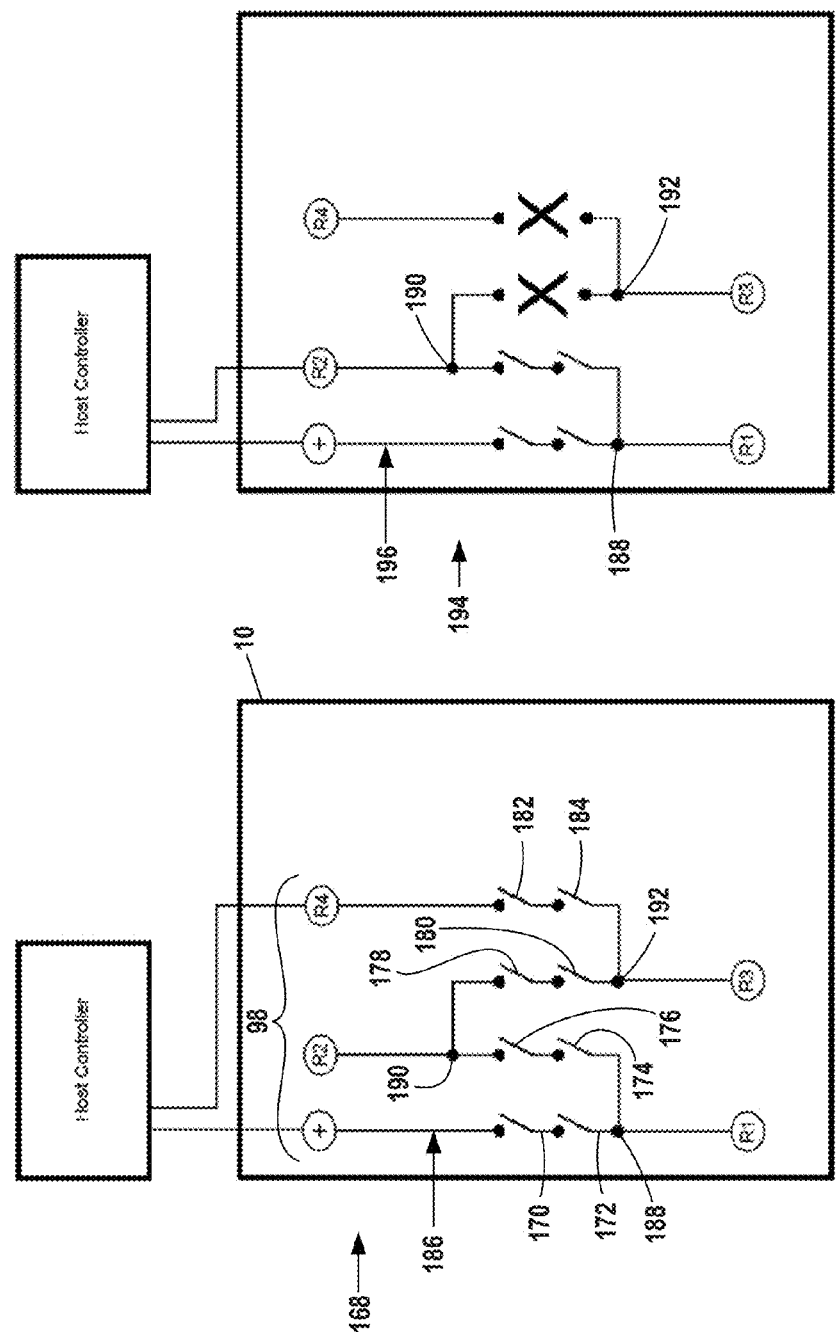
FIGS. 18-20 illustrate alarm circuits used in the assembly.

FIG. 18 diagrammatically represents a redundant power supply assembly 10 with four redundant pairs of power supply modules 14 mounted on the assembly and an alarm circuit 168, a relay 170-184 in each module. The relay contacts are closed when the output voltages and currents are in normal ranges. Conductor 186 in the circuit extends from the + terminal of alarm monitor connector 106 through the relays and to the R4 terminal in connector 106. The + and R4 terminals are connected to the ends of conductor 186 and to the host controller for the assembly. Unused R1, R2 and R3 terminals are connected to conductor 186 at junctions 188, 190 and 192.

In the event the output voltage or current supplied to a fieldbus segment by any of the eight power supply modules in the assemblies falls outside normal ranges, the contacts in the relay for the defective power supply module will open and break conductor 186. The break will be sensed by the host controller assembly which will generate a signal indicating a defective power supply module to alert an operator to the problem and the need to correct the problem by replacing the defective module.

FIG. 19 illustrates a series alarm circuit 194 used when only four diagnostic modules are mounted in an assembly 10. Circuit 194 includes a conductor 196 like conductor 186 but which extends only from the + terminal to junction 190 and to the R2 terminal of connector 106. Conductor 196 passes through the four relays in the four modules in the assembly. The host controller assembly monitors the four operative modules only.

Figure 20:
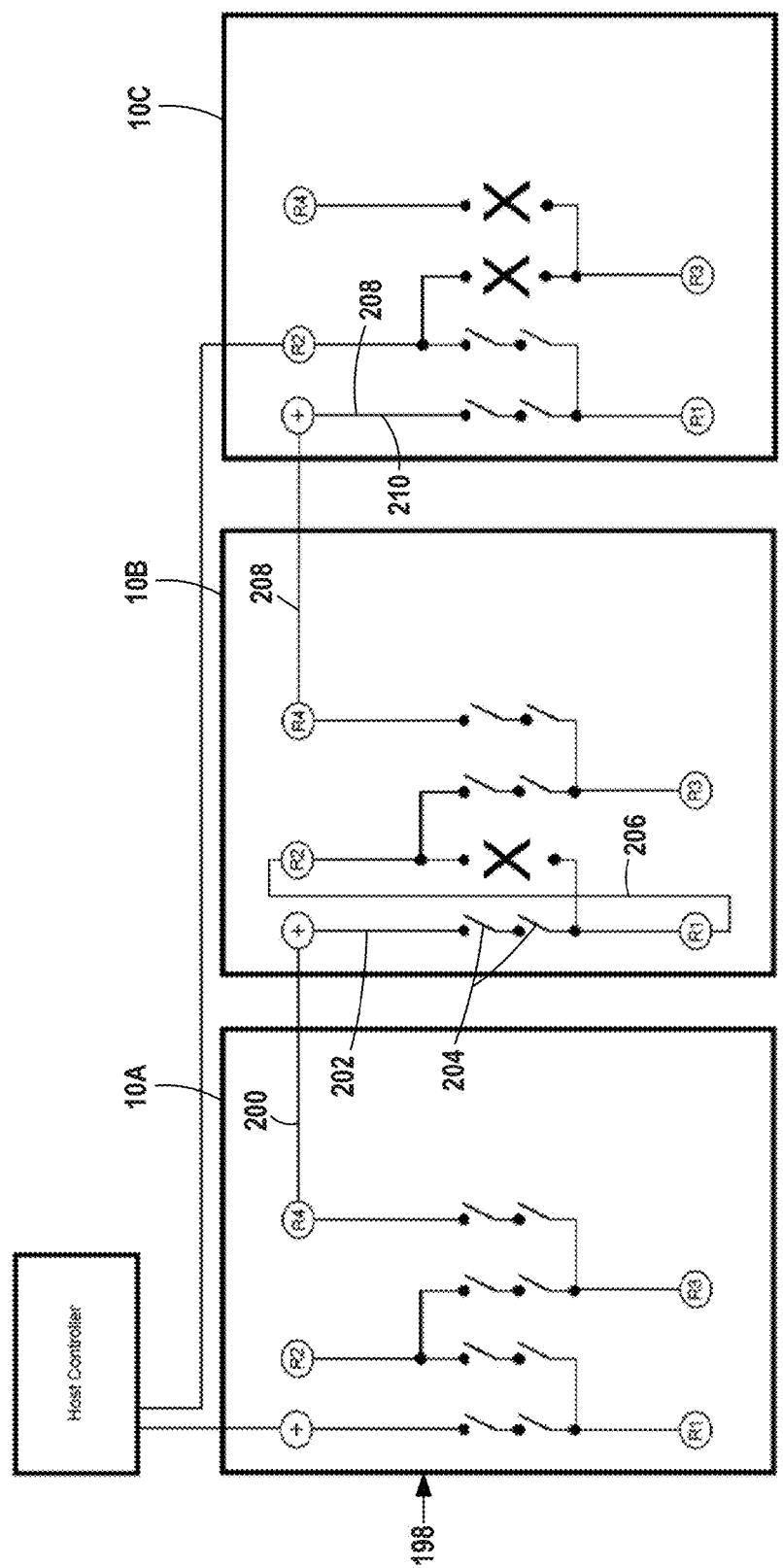

FIG. 20 illustrates a series alarm monitoring circuit 198 which is used to monitor the output voltages and currents of modules 14 on three assemblies 10A, 10B and 10C. The first assembly 10A is fully populated with eight power supply modules 14. The second assembly 10B is partially populated with two adjacent modules removed. The third assembly 10C is partially populated.

The portion of circuit 198 in first assembly 10A is like series monitoring circuit 168 shown in FIG. 18, but with the end of the circuit at the R4 terminal connected to input + terminal of the portion of the circuit in second assembly 10B. Assembly 10B is populated with six power supply modules only which, in turn, is connected to a third power supply motherboard assembly 10C which is populated with two pairs of redundant power supply modules only.

A conductor 200 extends from the R4 terminal in assembly 10A to the + terminal of the second assembly 10B.

Conductor 202 extends through two relays 204 in modules in the assembly and extends from these relays through terminal R1 and bridge section 206 to terminal R2 and then through four relays for two additional pairs of power supply modules mounted in the assembly 10B to the R4 terminal. The output from the R4 terminal for assembly 10B is connected to the + terminal for the third assembly by conductor 208.

Conductor 210 for assembly 10C extends through relays for the two pairs of power supply modules mounted in the assembly. The end of conductor 210 is connected to the R2 terminal for the assembly. The input + terminal for the first assembly 10A and the output terminal R2 for the third assembly 10C are connected to the host controller.

Failure of any of the power supply modules mounted on the three assemblies 10A, 10B and 10C illustrated in FIG. 20 breaks the series circuit to send an error signal to the controller assembly indicating the failure and the need for corrective action.

The alarm monitoring circuit extends through each of the relay contacts in each module mounted in a nest in an assembly and is connected to two of the +, R1, R2, R3 and R4 terminals shown in FIGS. 2 and 18-20, depending upon whether power supply modules are mounted in all nests in the assembly or modules are not mounted in some pairs of nests. Bridge conductors, like the portion of conductor 202 between the R1 and R2 terminals, may be connected between two of + R1, R2, R3 and R4 terminals to bypass pairs of nests without power supply modules.

What we claim as our invention is:

1. An assembly comprising a motherboard having a top surface; a module connector on the motherboard; a first nest on the motherboard top surface, the first nest comprising an elongate plastic body with opposed ends, feet on the motherboard top surface, a top wall above the motherboard top surface, two sidewalls, each sidewall extending between the opposed ends of the body and from the top wall down to the feet, a connector opening in the first nest top wall located over the module connector, two module support members, one module support member at each end of the body, first and second rigid body portions, each rigid body portion extending from the connector opening to one module support member, and two strips, each strip in extending along a sidewall on one side of the opening between the rigid portions; and two physical connections, each physical connection mounting one rigid portion of the first nest to the motherboard, each physical connection comprising a first surface on a rigid portion, a second surface on the motherboard, the first and second surfaces engaging each other; and a rotary fastener spaced from the surfaces, the rotary fastener securing the rigid portion to the motherboard; wherein the physical connections prevent the rotary fasteners from torque flexing of the strips during mounting of the first nest on the motherboard.

2. The assembly as in claim 1 including a shoulder on the top of one strip at the opening, wherein the shoulder partially stiffens the one strip.

3. The assembly as in claim 1 wherein each rigid portion includes one or more interior walls extending between the sidewalls.

4. The assembly as in claim 1 wherein the nest includes first and second locating posts, each post extending into a hole in the motherboard.

5. The assembly as in claim 4 wherein one locating post includes first members positioning the one post in one hole in the motherboard and the second post includes second members engaging another hole in the motherboard but permitting limited movement of the other post in the other hole toward or away from the one post, wherein said one post locates the nest on the motherboard and said other post maintains the position of the nest on the motherboard and prevents rotation of said rigid portions during securing of said portions on the motherboard by mounting screws.

6. The assembly as in claim 5 including third and fourth locating posts, the first and second locating posts on the first body portion and the third and fourth locating posts on the second body portion.

7. The assembly as in claim 1 wherein each sidewall comprises feet engaging the motherboard and vertical recesses between adjacent feet.

8. The assembly as in claim 1 comprising a second nest on the motherboard adjacent the first nest, and a first inductor mounted on the bottom of the motherboard underlying both said nests; and screws securing the nests to the motherboard, the screws located away from the inductor to provide access for a tool for engaging the screws.

9. The assembly as in claim 8 including a second inductor on the bottom of the motherboard underlying both nests, said screws between said inductors.

10. The assembly as in claim 1 including electronic components on the top surface of the motherboard under the modules, a roof overlying the top surface of the motherboard and spaced a distance above the top surface of the motherboard, the roof and the outer sidewalls of the end modules providing touch protection for the electronic components on the top surface of the motherboard.

11. The assembly as in claim 10 wherein said distance is about 9 mm.

12. The assembly as in claim 10 wherein the roof comprises a plurality of nest top walls.

13. The assembly as in claim 10 wherein said roof is flat.

14. An assembly comprising a motherboard; a module connector on the motherboard; a first nest on the motherboard, the nest comprising an elongate plastic body with opposed ends, a top wall, two sidewalls extending down from the top wall to feet, a connector opening in the nest top wall, two module support members, one module support member at each end of the body, first and second rigid body portions, each rigid body portion extending from the opening to one module support member, and two strips, each strip in a sidewall on one side of the opening and extending between the rigid portions; two physical connections, each physical connection mounting one rigid portion of the nest to the motherboard, each physical connection comprising a mounting pillar on a rigid body portion, the mounting pillar located between the sidewalls; a screw hole in the motherboard under the mounting pillar; a mounting screw extending through the screw hole and engaging the pillar; an anti-rotation member on the rigid portion, the anti-rotation member located away from the mounting pillar; and an anti-rotation surface on the motherboard, the anti-rotation surface engaging the anti-rotation member; wherein the anti-rotation surfaces engage the anti-rotation members to prevent rotation of the rigid body portions by torque exerted on the rigid body portions by the mounting screws when the mounting screws are threaded into the pillars.

15. The assembly as in claim 14 wherein each anti-rotation member comprises a post and each anti-rotation surface comprises a post opening in the motherboard, the posts in the post openings.

16. The assembly as in claim 14 wherein the motherboard includes a first post opening located under the nest and the nest includes a first location post having a surface, said post in said opening with said surface engaging the opening to position the nest on the motherboard.

17. The assembly as in claim 16 wherein the motherboard includes a second post opening and the nest includes a second location post in the second opening, the second location post having surfaces facing across the nest, such surfaces engaging opposed surfaces of the second opening only to allow limited movement of such post in such opening.

18. The assembly as in claim 16 wherein said post surface comprises a plurality of ribs spaced around the first post.

19. An assembly comprising a motherboard; a module connector on the motherboard; a first nest on the motherboard, the nest comprising an elongate plastic body with opposed ends, a top wall, two sidewalls extending down from the top wall to feet, a connector opening in the nest top wall, two module support members, one module support member at each end of the body, first and second rigid body portions, each rigid body portion extending from the opening to one module support member, and two strips, each strip in a sidewall on one side of the opening and extending between the rigid portions; and two physical connections, each physical connection mounting one rigid portion of the nest to the motherboard, including a module in the nest, the module comprising a contact nose engaging the module connector, and opposed module edges; each module edge comprising two spaced module friction engagement surfaces; each module support member comprising two spaced member friction engagement surfaces, one of said two spaced module friction engagement surfaces or said two spaced arm friction engagement surfaces located on a pair of elastically and non-destructively flexible ribs; the friction engagement surfaces on the ribs spaced apart a distance when the ribs are not flexed less than the distance between the other friction engagement surfaces; the module inserted in the nest with said module and member friction engagement surfaces engaging each other and said arms elastically flexed apart to form an elastic interference frictional fit securing the module in the nest to prevent shocks or vibrations or handling of the modules from impairing electrical connections between contacts in the contact nose and in the module connector.

20. The assembly as in claim 19 wherein each module support member comprises an arm extending above the top wall, said ribs on the arm, each rib facing toward the other rib for outward flexing movement upon insertion of a module into the nest.

21. An assembly comprising a motherboard; a module connector on the motherboard; a first module nest on the motherboard, the first module nest comprising an elongate plastic body with opposed ends, a connector opening in the elongate plastic body located over the module connector, two module support members, one module support member at each end of the elongate plastic body, first and second rigid body portions, each body portion extending from the connector opening to one module support member, two strips on opposite sides of the connector opening and extending between the first and second body portions; and an anti-rotation connection between each rigid body portion and the motherboard, each anti-rotation connection comprising a screw-mounting member on a rigid body portion, a hole extending through the motherboard and a screw extending through the hole and engaging the screw mounting portion, and an anti-rotation surface on the motherboard located a distance from the screw hole and an anti-rotation member on the rigid body portion engaging the anti-rotation surface, wherein the anti-rotation connections prevent torque exerted on the body portions by the screws from flexing the strips.

22. The assembly as in claim 21 wherein each anti-rotation connection includes two spaced apart recesses in the motherboard and two parts of a body portion extending into said recesses.

23. The assembly as in claim 22 wherein said parts comprise posts and said recesses comprise holes, said posts in said holes.

24. The assembly as in claim 23 wherein one post includes a number of circumferentially spaced alignment ribs, said ribs engaging the interior of a hole in the motherboard.

* * * * *

UNITED STATES PATENT AND TRADEMARK OFFICE
CERTIFICATE OF CORRECTION

PATENT NO. : 9,727,098 B2  
APPLICATION NO. : 14/676301  
DATED : August 8, 2017  
INVENTOR(S) : Gillespie et al.

Page 1 of 1

It is certified that error appears in the above-identified patent and that said Letters Patent is hereby corrected as shown below:

In the Claims

Column 9, Line 43, delete "in".

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*